US011351548B2

(12) United States Patent
Jones et al.

(10) Patent No.: US 11,351,548 B2
(45) Date of Patent: Jun. 7, 2022

(54) ANALYTE SENSOR PACKAGE WITH DISPENSE CHEMISTRY AND MICROFLUIDIC CAP

(71) Applicant: Maxim Integrated Products, Inc., San Jose, CA (US)

(72) Inventors: Joy T. Jones, San Jose, CA (US); Ronald B. Koo, Los Altos, CA (US); Paul G. Schroeder, San Jose, CA (US); Albert Song, San Jose, CA (US); Sudarsan Uppili, Portland, OR (US); Xiaoming Yan, Campbell, CA (US); Qi Luo, San Jose, CA (US); Sean Cahill, Palo Alto, CA (US); Henry Grage, Johns Creek, GA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 600 days.

(21) Appl. No.: 16/160,339

(22) Filed: Oct. 15, 2018

(65) Prior Publication Data
US 2019/0111420 A1    Apr. 18, 2019

Related U.S. Application Data

(60) Provisional application No. 62/571,970, filed on Oct. 13, 2017, provisional application No. 62/571,953, filed on Oct. 13, 2017.

(51) Int. Cl.
*B01L 3/00* (2006.01)
*B81B 7/00* (2006.01)
*B81C 1/00* (2006.01)

(52) U.S. Cl.
CPC ......... *B01L 3/508* (2013.01); *B01L 3/502715* (2013.01); *B81B 7/0061* (2013.01);
(Continued)

(58) Field of Classification Search
CPC ............... B01L 3/508; B01L 3/502715; B01L 2300/0877; B01L 2300/0887;
(Continued)

(56) References Cited

U.S. PATENT DOCUMENTS

| 5,491,097 A | * | 2/1996 | Ribi | ............... | G01N 33/5438 |
| | | | | | 436/518 |
| 5,867,380 A | | 2/1999 | Lee | | |
| 6,437,551 B1 | * | 8/2002 | Krulevitch | ......... | G01N 33/5438 |
| | | | | | 324/649 |
| 8,728,844 B1 | | 5/2014 | Liu et al. | | |

(Continued)

OTHER PUBLICATIONS

Merriam-Webster dictionary, http://web.archive.Org/web/20151220142311/https://www.merriam-webster.com/dictionary/perimeter, obtained using Wayback Machine from Dec. 20, 2015 (Year: 2015).*

*Primary Examiner* — Matthew D Krcha
*Assistant Examiner* — Sophia Y Lyle
(74) *Attorney, Agent, or Firm* — Kevin E. West; Advent, LLP

(57) ABSTRACT

A sensor system includes an assay chamber configured to receive a fluid sample. Dispense chemistry disposed within the assay chamber. A first electrode structure includes at least one conductive element and a second electrode structure proximate to the first electrode structure is configured to transmit an electrical signal through the fluid sample. The first electrode structure is configured to receive the electrical signal transmitted through the fluid sample and responsively generate a sense signal. The sense signal being indicative of an interaction of the fluid sample with the dispense chemistry. A controller is electrically coupled to the first electrode structure and configured to identify at least one analyte in the fluid sample based on at least the sense signal generated by the first electrode structure. The first electrode structure is embedded within a base substrate and the second electrode structure is embedded within a microfluidic cap that is coupled to the base substrate.

19 Claims, 12 Drawing Sheets

(52) U.S. Cl.
CPC ..... *B81C 1/00309* (2013.01); *B01L 2200/026* (2013.01); *B01L 2200/0647* (2013.01); *B01L 2300/042* (2013.01); *B01L 2300/0645* (2013.01); *B01L 2300/0848* (2013.01); *B01L 2300/0877* (2013.01); *B01L 2300/0887* (2013.01); *B81B 2201/0214* (2013.01); *B81B 2203/04* (2013.01); *B81C 2203/035* (2013.01)

(58) Field of Classification Search
CPC ..... B01L 2200/0647; B01L 2300/0848; B01L 2200/026; B01L 2300/042; B01L 2300/0645; B81B 7/0061; B81B 2201/0214; B81B 2203/04; B81C 2203/035; G01N 33/50; G01N 27/02; G01N 27/22; G01N 33/4836; G01N 27/30–27/38; G01N 27/745; G01N 33/54326–5434; G01N 33/02–146; G01N 33/18; A61N 1/04
See application file for complete search history.

(56) References Cited

U.S. PATENT DOCUMENTS

| | | | |
|---|---|---|---|
| 9,375,711 B2 | 6/2016 | Hoofman et al. | |
| 9,515,159 B2 | 12/2016 | Bischopink et al. | |
| 9,670,445 B1 | 6/2017 | Kuo et al. | |
| 2006/0065361 A1 | 3/2006 | Stiene et al. | |
| 2007/0080060 A1* | 4/2007 | Frey | G01N 27/3276 |
| | | | 204/403.01 |
| 2010/0068764 A1* | 3/2010 | Sista | B01L 3/502784 |
| | | | 435/79 |
| 2010/0089135 A1 | 4/2010 | de Langen et al. | |
| 2010/0120016 A1* | 5/2010 | Li | C12Q 1/04 |
| | | | 435/5 |
| 2010/0270156 A1* | 10/2010 | Srinivasan | F04B 19/006 |
| | | | 204/450 |
| 2012/0034684 A1* | 2/2012 | Campbell | G01N 33/54333 |
| | | | 435/287.2 |
| 2015/0008543 A1* | 1/2015 | Hong | B81B 3/0059 |
| | | | 257/417 |

* cited by examiner

ANALYTE SENSOR PACKAGE WITH DISPENSE CHEMISTRY AND MICROFLUIDIC CAP

The present application claims the benefit under 35 U.S.C. § 119(e) of U.S. Provisional Application Ser. No. 62/571,953, entitled "Analyte sensor package with microfluidic cap and method for analyzing fluid samples," filed Oct. 13, 2017 and U.S. Provisional Application Ser. No. 62/571,970, entitled "Analyte sensor package with microfluidic cap and dispense chemistry and method for analyzing fluid samples," filed Oct. 13, 2017. The above-referenced Provisional Applications are herein incorporated by reference in their entirety.

BACKGROUND

Analysis of components in biological fluids (e.g., blood, urine, saliva, etc.) and other fluids (e.g., liquid or gas samples, etc.) is continuing to increase in importance. Biological fluid tests can be used in a health care environment to determine physiological and/or biochemical states, such as disease, mineral content, pharmaceutical drug effectiveness, and/or organ function. For example, it may be desirable to determine an analyte concentration within an individual's blood to manage a health condition, such as diabetes. Consequently, the individual may go to a diagnostic laboratory or medical facility to have blood drawn and then wait (often for an extended period) for analysis results. The individual may typically schedule a follow-up visit with a healthcare provider to review the analysis results, which can also add cost.

DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

Figure 3:
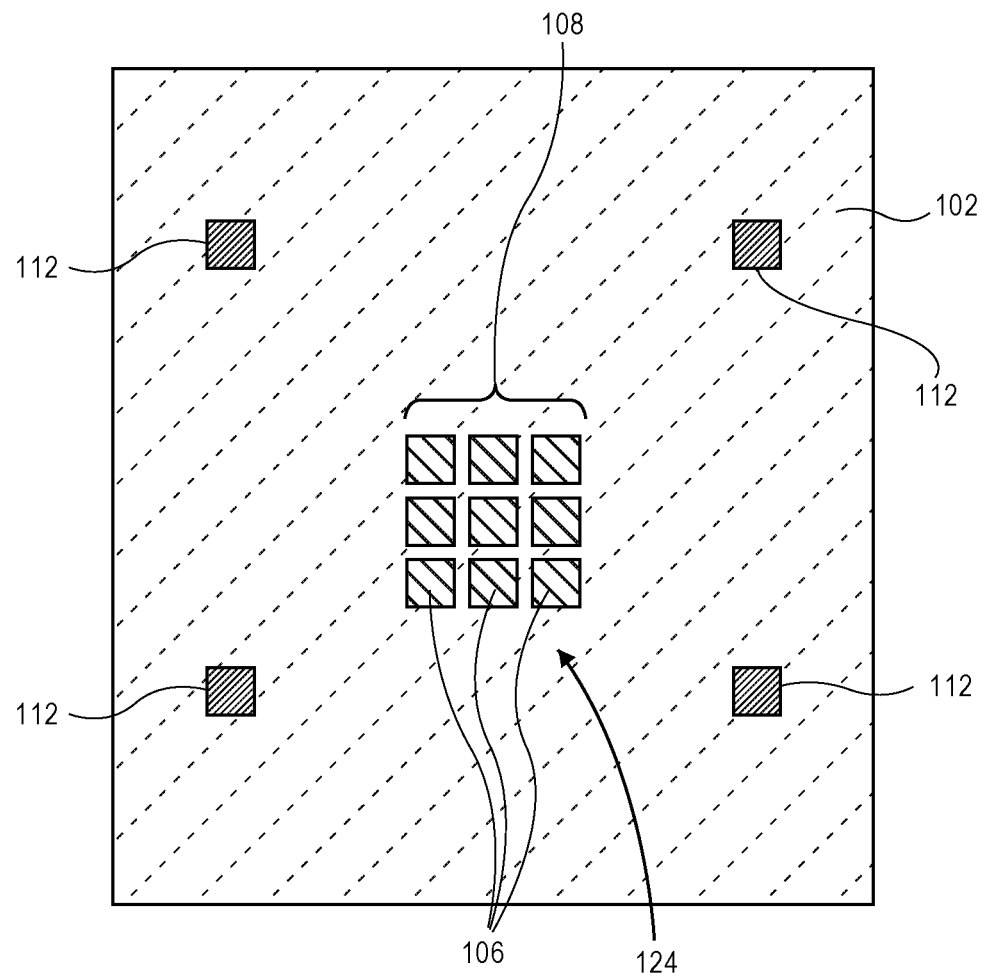
Figure 4:
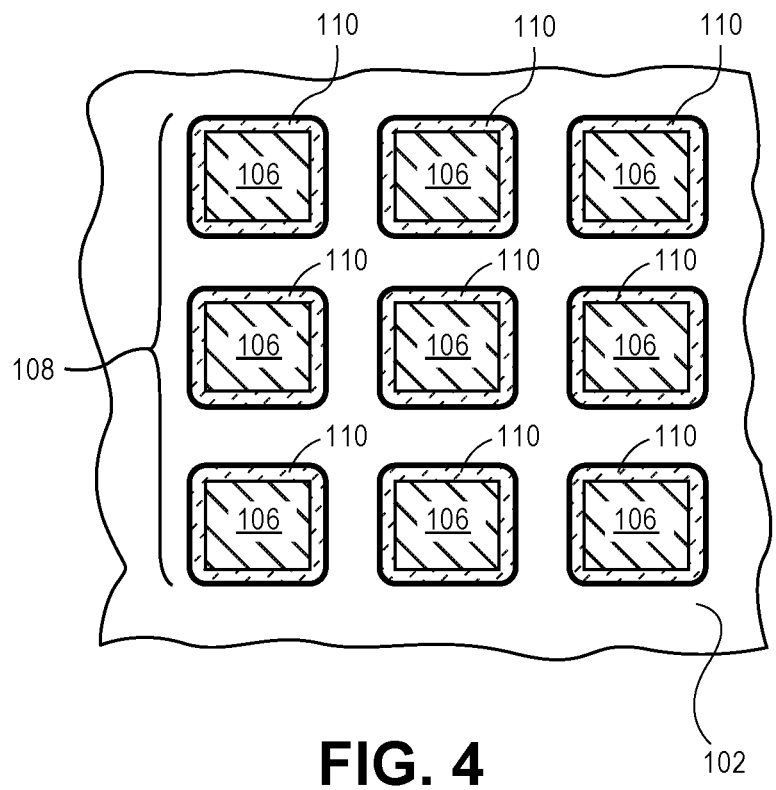
Figure 5:
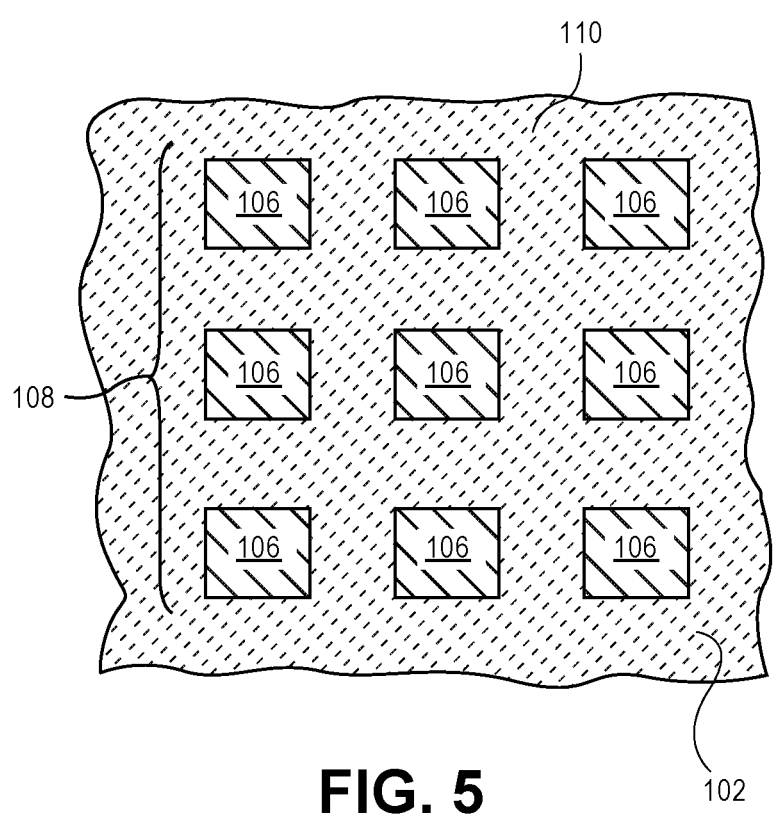
Figure 6:
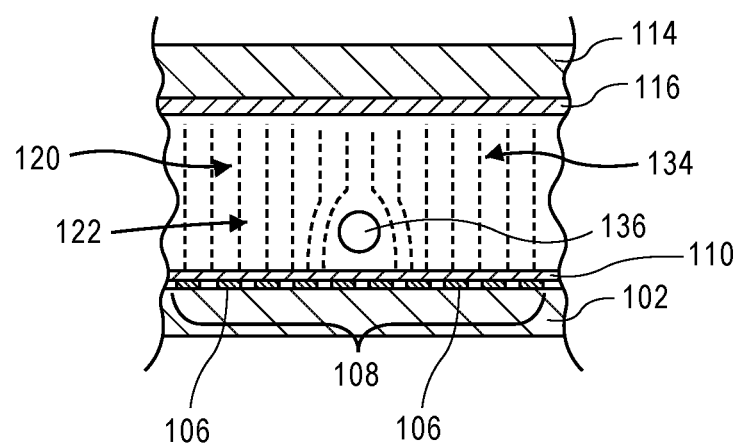
Figure 7:
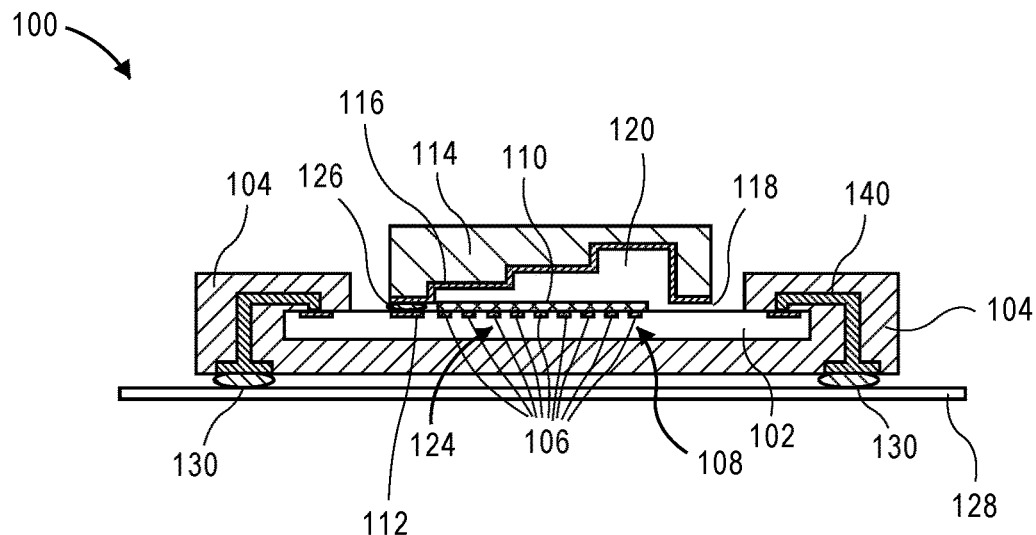
Figure 8:
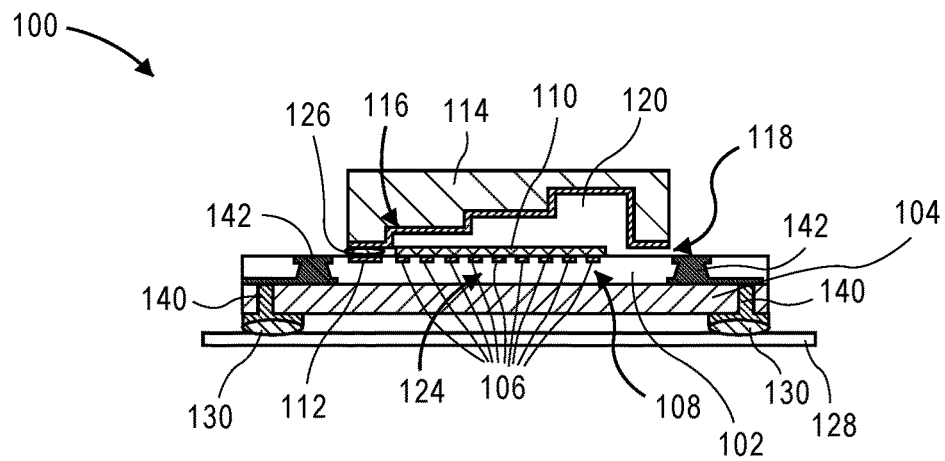
Figure 9:
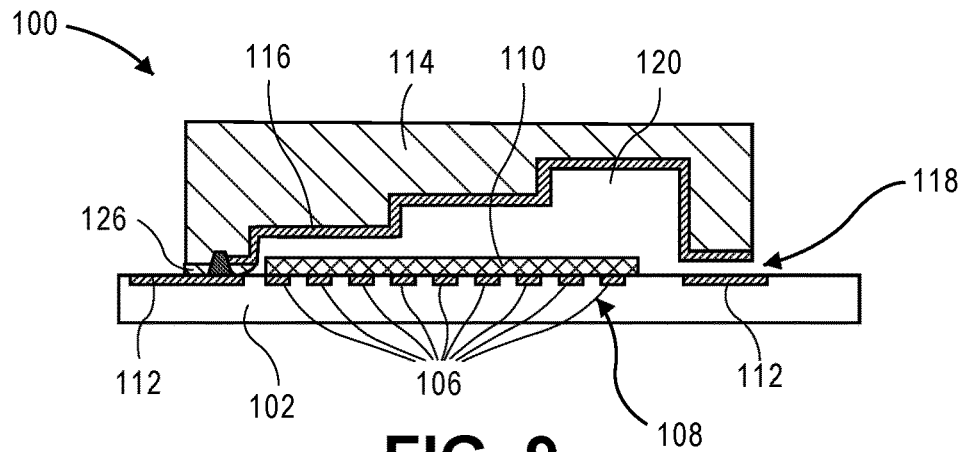
Figure 10:
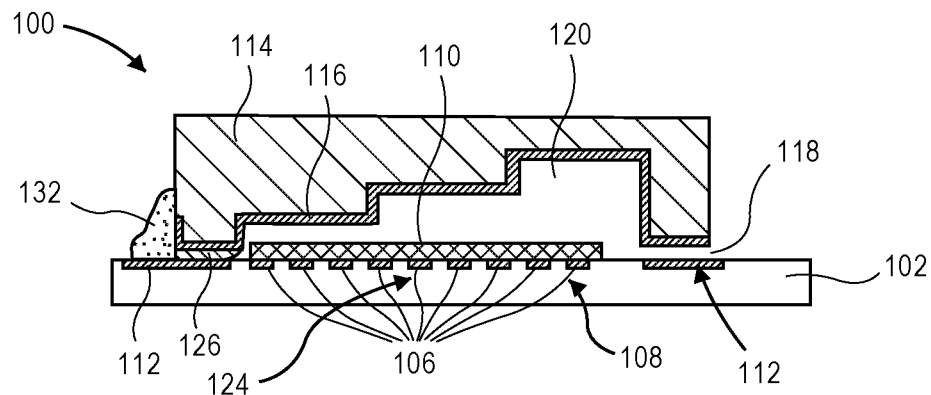
Figure 11:
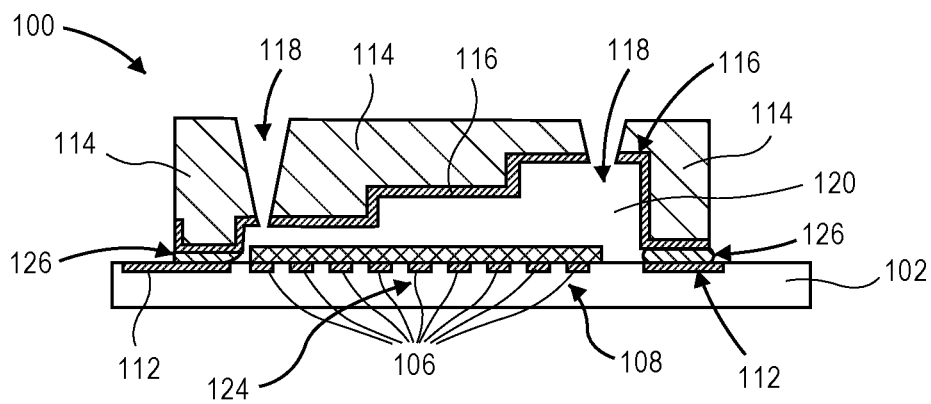
Figure 12:
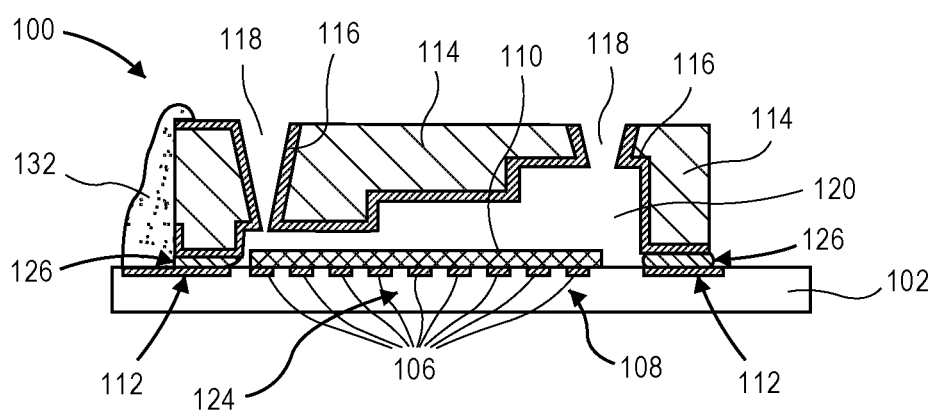
Figure 13:
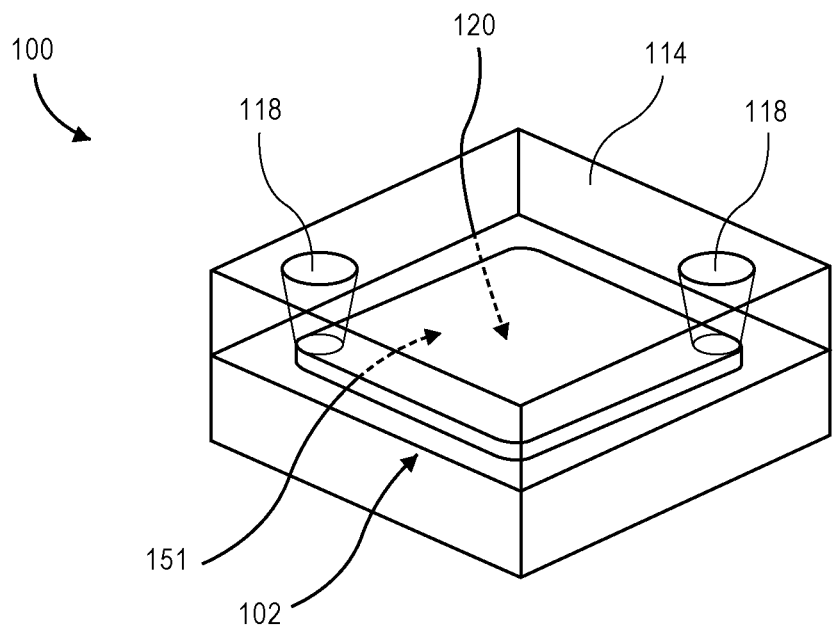
Figure 14:
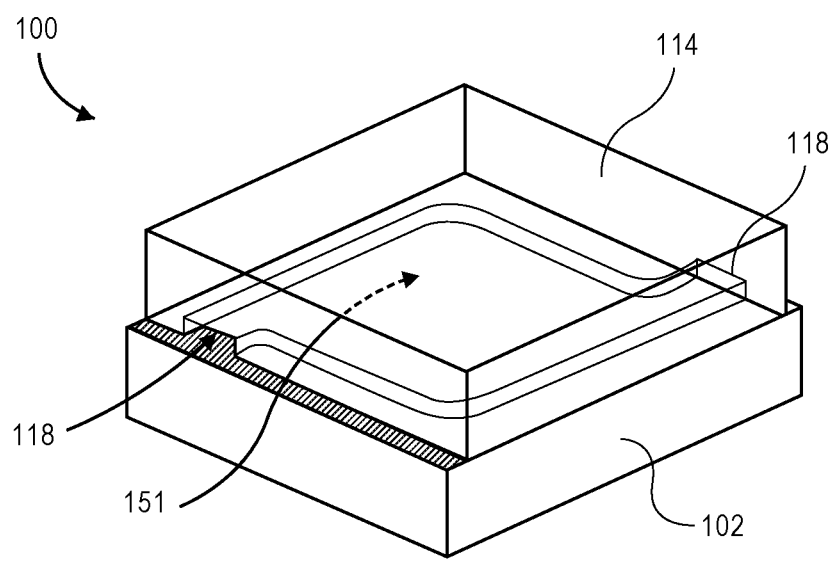
Figure 15A:
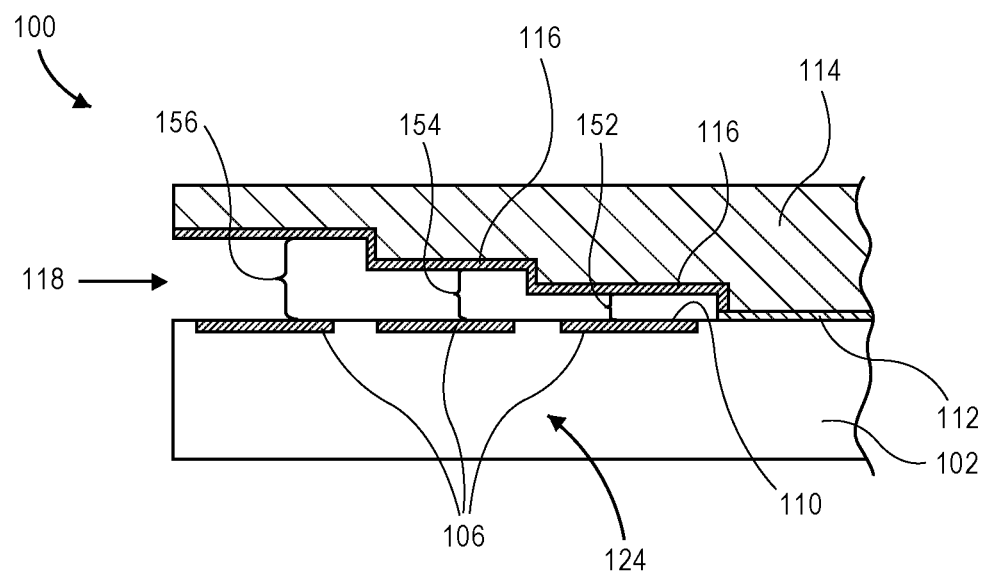
Figure 15B:
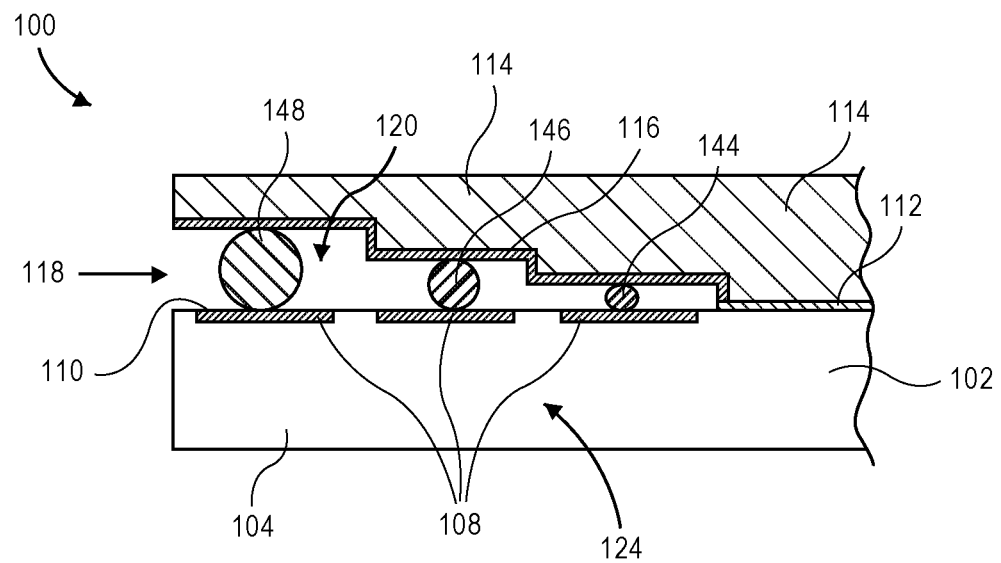
Figure 16A:
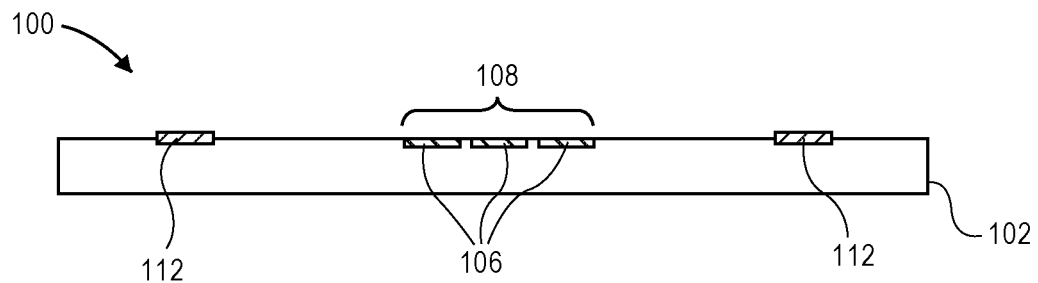
Figure 16B:
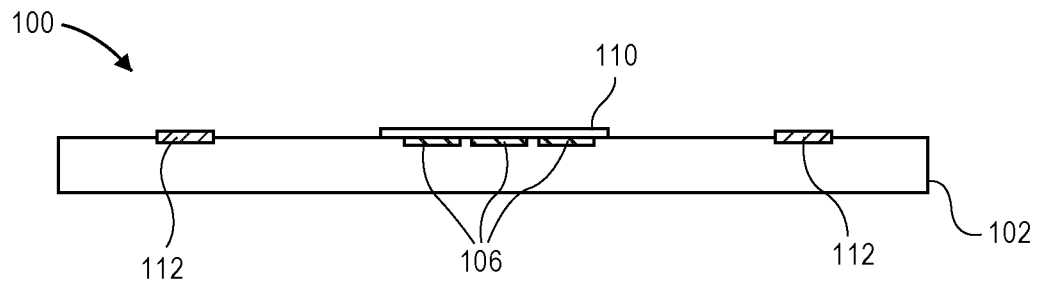
Figure 16C:
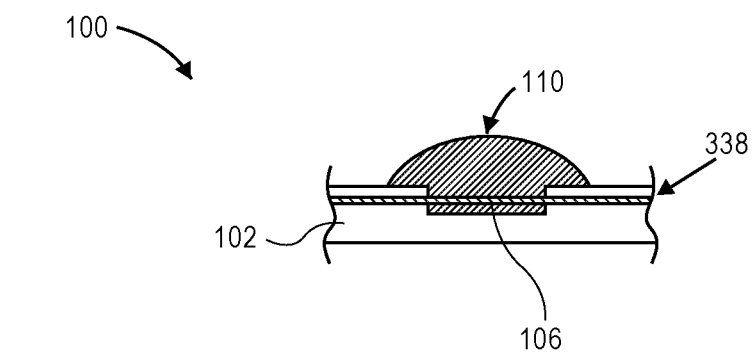
Figure 16D:
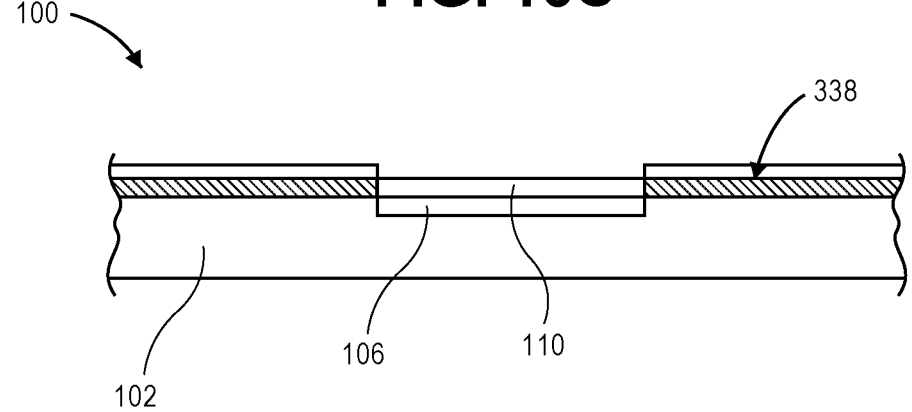
Figure 16E:
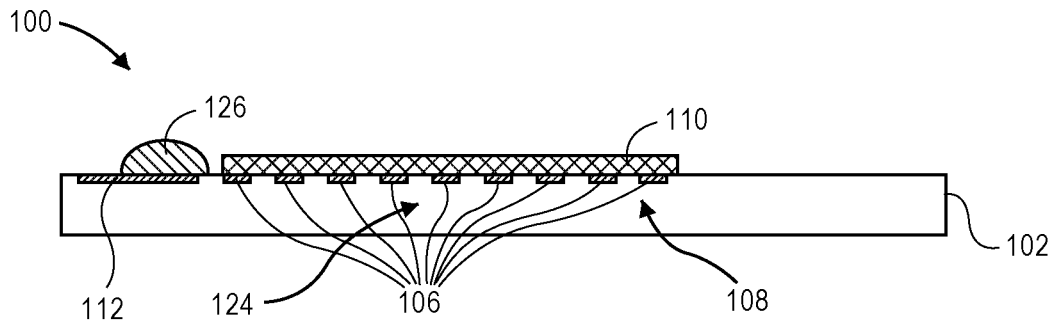
Figure 16F:
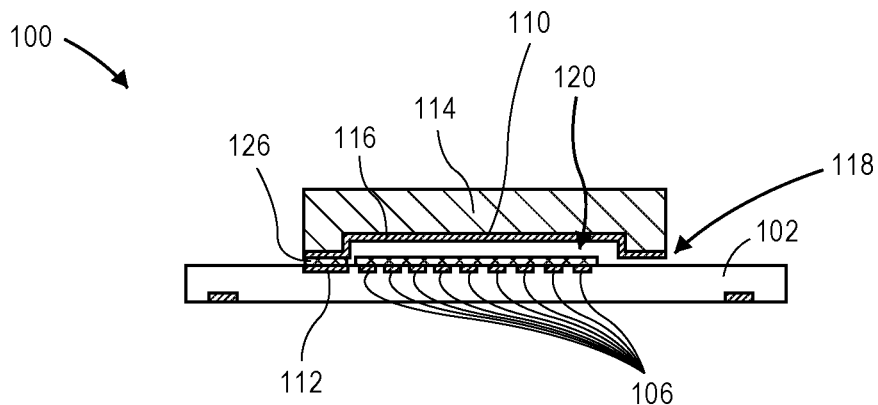
Figure 16G:
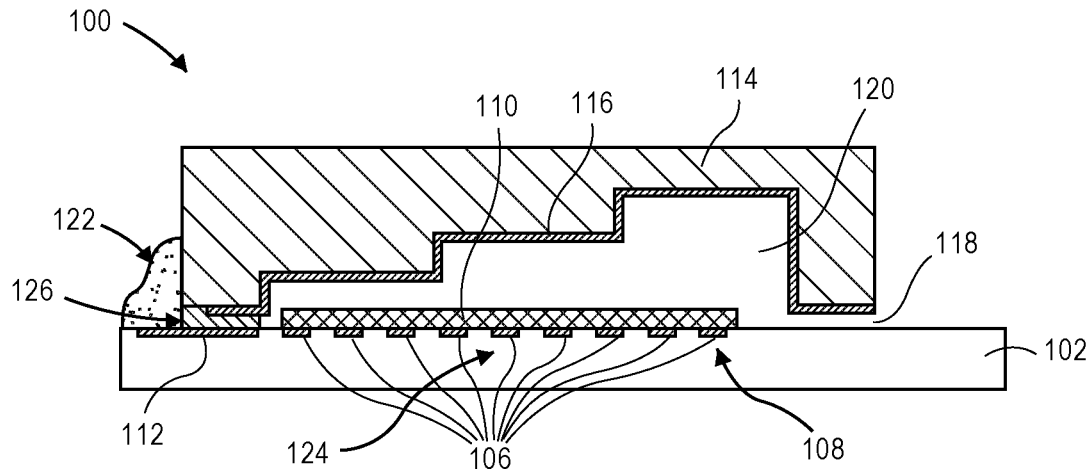
Figure 16H:
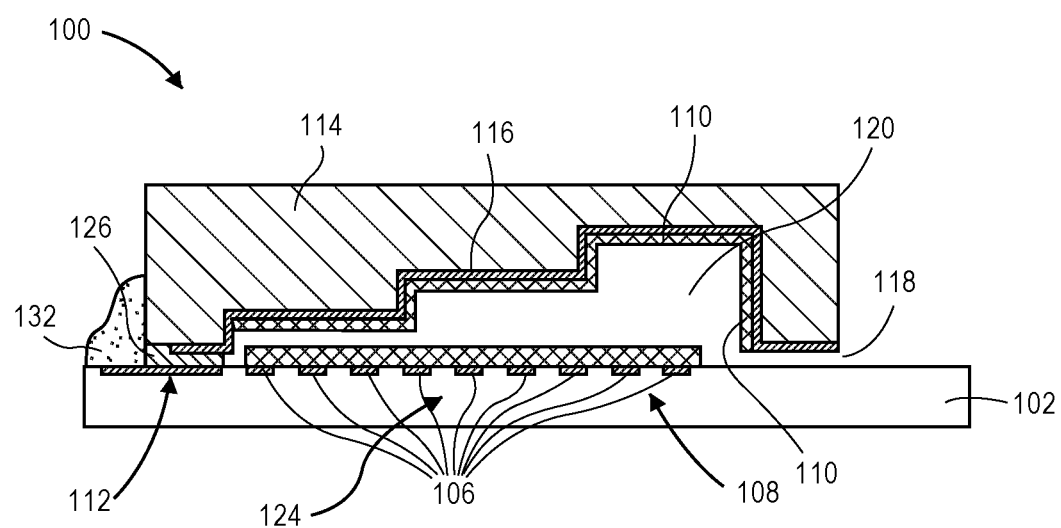
Figure 17:
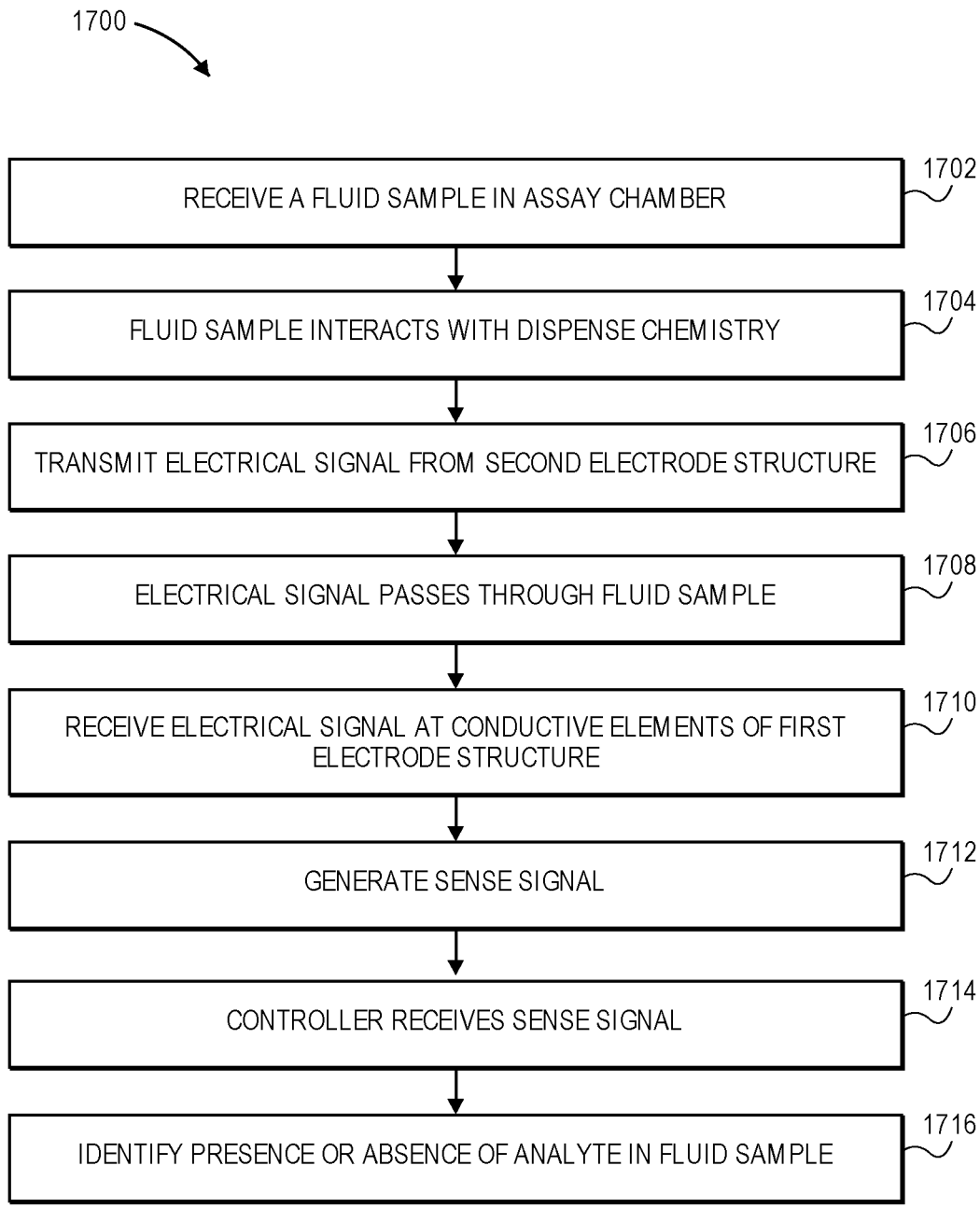

FIG. 3 a block diagram representation of an example of a first electrode structure disposed on a base substrate of an embodiment of a sensor system;

FIG. 4 is a block diagram representation of an example of a first electrode structure with dispense chemistry disposed over the conductive elements in an embodiment of a sensor system;

FIG. 5 is a block diagram representation of an example of a first electrode structure with dispense chemistry disposed over the surface of the first electrode structure in an embodiment of a sensor system;

FIG. 6 is a block diagram representation of an example of dispense chemistry disposed within an assay chamber of an embodiment of a sensor system;

FIG. 7 is a block diagram representation of an embodiment of a sensor system including a microfluidic cap having a stepped configuration;

FIG. 8 is a block diagram representation of an embodiment of a sensor system including a microfluidic cap having a stepped configuration;

FIG. 9 is a block diagram representation of an embodiment of a sensor system including a microfluidic cap having a stepped configuration;

FIG. 10 is a block diagram representation of an embodiment of a sensor system including a microfluidic cap having a stepped configuration;

FIG. 11 is a block diagram representation of an embodiment of a sensor system including a microfluidic cap having a stepped configuration and at least one aperture extending through the microfluidic cap;

FIG. 12 is a block diagram representation of an embodiment of a sensor system including a microfluidic cap having a stepped configuration and at least one aperture extending through the microfluidic cap;

FIG. 13 is a block diagram representation of an embodiment of a sensor system including a microfluidic cap;

FIG. 14 is a block diagram representation of an embodiment of a sensor system including a microfluidic cap;

FIG. 15A is a block diagram representation of an embodiment of a sensor system including an example of a microfluidic cap having a stepped configuration;

FIG. 15B is a block diagram representation of the embodiment of a sensor system of FIG. 15A including an example of a microfluidic cap having a stepped configuration with different analytes disposed within the assay chamber;

FIG. 16A through FIG. 16H are diagrammatic representations of the different stages of an embodiment of the sensor system during an example fabrication process; and FIG. 17 is a flowchart representation of an example of a method of using an embodiment of the sensor system.

DETAILED DESCRIPTION

Overview

Onsite sensor systems can be used to analyze freshly collected fluid samples rather than having to travel to a medical facility or preserve the fluid samples for transport to a remotely located lab for analysis. Onsite sensor systems can also be used to obtain faster results for analyzed fluid samples, to perform analysis of fluid samples in remote areas where transportation and/or access to test equipment is limited, to perform self-tests for patients who need to have one or more of their biological samples (e.g., blood, saliva, urine, etc.) analyzed frequently (rather than having to go to a healthcare facility each time a test is needed), and so forth. Thus, there is an increasing demand for devices that can facilitate onsite (e.g., point-of-need) testing.

Accordingly, sensor systems for analysis of fluids are described. In an example embodiment of the disclosure, a sensor system includes an assay chamber configured to receive a fluid sample. Dispense chemistry is disposed within the assay chamber. The sensor system includes a first electrode structure including at least one conductive element. The sensor system includes a second electrode structure proximate to the first electrode structure. The second electrode structure is configured to transmit an electrical signal through the fluid sample, and the first electrode structure is configured to receive the electrical signal transmitted through the fluid sample and responsively generate a sense signal. The sense signal is representative of a reaction between the fluid sample and the dispense chemistry. The sensor system includes a controller that is electrically coupled to the first electrode structure. The controller is configured to identify at least one analyte in the fluid sample based at least on the sense signal generated by the first electrode structure. The sensor system includes a base substrate. The first electrode structure or the second electrode structure is embedded within the base substrate. In an alternative embodiment, one of the first electrode and the second electrode is coupled to the base substrate.

In another example embodiment of the disclosure, a sensor system includes a base substrate and an assay chamber configured to receive a fluid sample. Dispense chemistry is disposed within the assay chamber, where the dispense chemistry includes a dried aqueous solution having a plurality of coated microbeads. The sensor system includes a first electrode structure embedded within the base substrate. The first electrode structure includes an array of conductive elements arranged in a M by N matrix, where M is a number of rows of conductive elements and N is a number of columns of conductive elements. The sensor system includes a microfluidic cap coupled to the base structure. The microfluidic cap comprises a second electrode structure. The second electrode structure is proximate to the first electrode structure and configured to transmit an electrical signal through the fluid sample, and the first electrode structure is configured to receive the electrical signal transmitted through the fluid sample and responsively generate a sense signal. The sense signal is indicative of a reaction between the fluid sample and the dispense chemistry. The sensor system includes a controller that is electrically coupled to the first electrode structure. The controller is configured to identify at least one analyte in the fluid sample based at least on the sense signal generated by the first electrode structure. The first electrode structure and the second electrode structure define first and second portions of the assay chamber. In an alternative embodiment, one of the first electrode and the second electrode is coupled to the base substrate.

In another example embodiment of the disclosure, a sensor system includes a base substrate, an assay chamber configured to receive a fluid sample and dispense chemistry disposed within the assay chamber. A sensor is embedded within the base substrate. The sensor includes a first electrode structure. A microfluidic cap coupled to the base substrate. The microfluidic cap includes a second electrode structure configured to transmit an electrical signal through the fluid sample. The first electrode structure is configured to receive the electrical signal transmitted through the fluid sample and responsively generate a sense signal. The sense signal is indicative of an interaction between the fluid sample and the dispense chemistry. A controller electrically coupled to the first electrode structure and configured to identify at least one analyte in the fluid sample based on at least the sense signal generated by the first electrode structure.

Example Implementations

Figure 1:
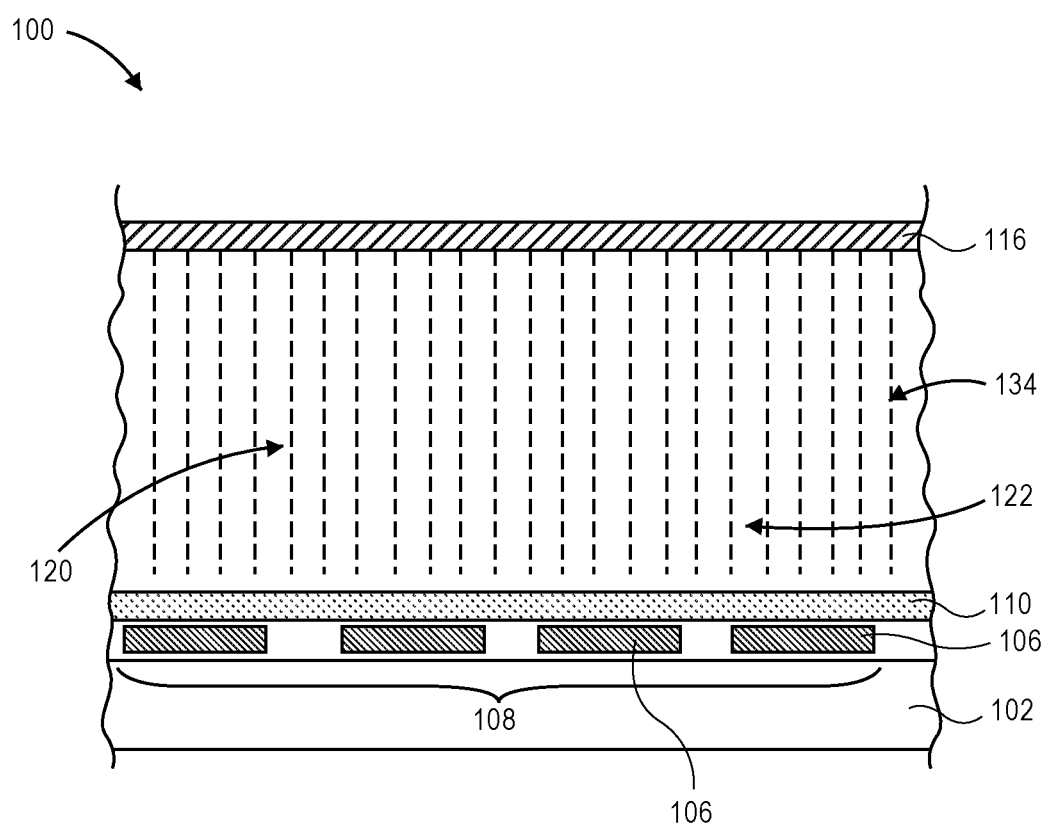
FIG. 1 is a cross sectional side view of a diagrammatic representation of an embodiment of a sensor system.

Referring to FIG. 1, a diagrammatic representation of an embodiment of a sensor system 100 configured to analyze a fluid sample 122 is shown. The sensor system 100 detects the presence and/or absence of one or more analytes within the fluid sample 122. In an embodiment, the sensor system 100 determines at least one characteristic (e.g., an amount, spatial distribution, dimension, concentration, etc.) of one or more particles (e.g., cells, biological structures, beads, microparticles, etc.) in the fluid sample 122. Throughout the disclosure, the words sensor system and sensor package may be used interchangeably.

In an embodiment, the sensor system 100 is utilized as a test strip. In an embodiment, the sensor system 100 is coupled to an external device. Examples of external devices include, but are not limited to, a mobile device, a smartphone, a wearable device, a tablet, a digital camera, a notebook computer, a media player, a portable gaming device, a computer, and an analysis instrument. In an embodiment, the sensor system 100 is a component of a device. Examples of devices with a embedded sensor system 100 include, but are not limited to, a mobile device, a smartphone, a wearable device, a tablet, a digital camera, a notebook computer, a media player, a portable gaming device, a computer, and an analysis instrument.

The sensor system 100 includes a base substrate 102, a first electrode structure 108, a second electrode structure 116, an assay chamber 120 and dispense chemistry 110. The assay chamber 120 is configured to receive a fluid sample 122. The dispense chemistry 110 is disposed within the assay chamber 120. The presence of one or more analytes in the fluid sample 122 results in a specific reaction with the dispense chemistry 110. In an embodiment, the second electrode structure 116 is configured to transmit one or more electrical signals 134 through at least a portion of the fluid sample 122 deposited within the assay chamber 120. The first electrode structure 108 is configured to receive one or more electrical signals 134 that have passed through the fluid sample 122 and responsively generate a sense signal. The sense signal is indicative of the presence and/or absence of one or more analytes in the fluid sample 122. In an embodiment, the first electrode structure 108 includes a plurality of conductive elements 106. The sense signal is based on the impedance and/or capacitance between the second electrode structure 116 and one or more conductive elements 106 resulting from the presence of one or more particles (e.g., an analyte) in the fluid sample 122.

In an embodiment, the first electrode structure 108 is configured to transmit one or more electrical signals 134 through at least a portion of the fluid sample 122 deposited within the assay chamber 120. The second electrode structure 116 is configured to receive one or more electrical signals 134 that have passed through the fluid sample 122 and responsively generate a sense signal. In an embodiment, the second electrode structure 116 includes a plurality of conductive elements 106.

In an embodiment, the second electrode structure 116 is disposed proximate to the first electrode structure 108. In an embodiment, the assay chamber 120 is disposed between the first electrode structure 108 and the second electrode structure 116. In an embodiment, the assay chamber 120 is defined between the first electrode structure 108 and the second electrode structure 116. In an embodiment, the first electrode structure 108 defines a first surface of the assay chamber 120 and the second electrode structure 116 defines a second surface of the assay chamber 120. In an embodiment, the first electrode structure 108 and the second electrode structure 116 define at least a portion of opposing surfaces of the assay chamber 120. In an embodiment, the first electrode structure 108 and the second electrode structure 116 are disposed along a perimeter of the assay chamber 120.

The dispense chemistry 110 is disposed within the assay chamber 120. In an embodiment, the dispense chemistry 110 is disposed on at least a portion of the first electrode structure 108. In an embodiment, the dispense chemistry 110 is disposed on at least a portion of the second electrode structure 116. In an embodiment, the dispense chemistry 110 is disposed on at least a portion of both the first electrode structure 108 and the second electrode structure 116.

In an embodiment, the dispense chemistry 110 includes a water-based polymer solution/particle mixture that is placed and/or dried (e.g., a dried aqueous solution) on one or both the first electrode structure 108 and the second electrode structure 116. The water-based polymer solution/particle mixture operates as a hydrophilic surface one or both of the first electrode structure 108 and the second electrode structure 116. In an embodiment, the dispense chemistry 110 and/or the water-based polymer solution/particle mixture includes one or more of water, a detergent, an alcohol, a starch, and at least one microbead array. In an embodiment, the dispense chemistry 110 includes one or more of maltodextrin, stabilizers, catalysts, and buffers. The dispense chemistry 110 may include other components and/or ingredients.

In an embodiment, the dispense chemistry 110 includes a total solid content of approximately 5% v/v with a particle content of approximately 0.5% and a particle size of approximately 0.4-3 µm. In an embodiment, the dispense chemistry 110 includes approximately 70-95% water, 3-12% alcohol (e.g., ethanol), 1-5% sucrose, 1-2% detergent (e.g., bovine serum albumin (BSA)), 0.5-5% detergent (e.g., M600), and/or a plurality of coated microbeads. In an embodiment, the dispense chemistry 110 is in the form of a film disposed over one or both of the first electrode structure 108 and the second electrode structure 116, where the thickness of the dispense chemistry 110 film is approximately 1 µm. The dispense chemistry 110 may include other configurations, such as for example, solid content, particle content, thickness, particle size, and configurations for other assays.

In an embodiment, the dispense chemistry 110 includes one or more different biomaterials to perform one or more different assays. In an embodiment, an assay is a test performed by adding and/or contacting one or more reagents (e.g., dispense chemistry 110) to a fluid sample 122 and detecting analytes in the fluid sample 122 based on a reaction of the fluid sample 122 with the dispense chemistry 110. For example, dispense chemistry 110 including coated microbeads (e.g., beads including or coated with one or more coatings and/or reagents) may agglutinate or agglomerate when a certain analyte is present in the fluid sample 122. Some examples of assays include agglutination or agglomeration assays including, but not limited to, immunoassays, kinetic agglutination assays, agglomeration-of-beads assays, kinetic agglomeration-of-beads assays, coagulation assays, kinetic coagulation assays, surface antigen assays, receptor assays from biopsy procedures, circulating blood cells assays, and circulating nucleic acid assays.

As mentioned above, the sensor system 100 includes a base substrate 102. In an embodiment, the first electrode structure 108 is coupled to the base substrate 102. In an embodiment, the second electrode structure 116 is coupled to the base substrate 102. In an embodiment, the first electrode structure 108 is formed within the base substrate 102. In an embodiment, the second electrode structure 116 is formed within the base substrate 102. In an embodiment, the first electrode structure is embedded within the base substrate 102. In an embodiment, the second electrode structure 116 is embedded within the base substrate 102. In an embodiment, the first electrode structure 108 is a portion of the base substrate 102. In an embodiment, the second electrode structure 116 is a portion of the base substrate 102.

The base substrate 102 can include a variety of materials and/or configurations, such as a semiconductor material (e.g., silicon), a shallow trench isolation oxide (and/or a field oxide (FOX)), and/or an active portion (e.g., at least one electrode) that has been processed to include active circuitry. In an embodiment, the base substrate 102 comprises an n-type silicon wafer or a p-type silicon wafer. In an embodiment, the base substrate 102 comprises group V elements (e.g., phosphorus, arsenic, antimony, etc.) configured to furnish n-type charge carrier elements. In an embodiment, the base substrate 102 comprises group IIIA elements (e.g., boron, etc.) configured to furnish p-type charge carrier elements. In an embodiment, the base substrate 102 includes integrated circuits, which may be configured in a variety of ways. For example, the integrated circuits may include digital integrated circuits, analog integrated circuits, mixed-signal circuits, and so forth. In one or more implementations, the integrated circuits may include digital logic devices, analog devices (e.g., amplifiers, etc.), and combinations thereof, and so forth. As described above, the integrated circuits may be fabricated utilizing various fabrication techniques. For example, the integrated circuits may be fabricated via complimentary metal-oxide-semiconductor (CMOS) techniques, bi-polar semiconductor techniques, and so forth. In an embodiment, the sensor system 100 comprises a single chip.

In an embodiment, the sensor system 100 includes a controller (not shown). In an embodiment, the controller is electrically coupled to the first electrode structure 108 and configured to receive the sense signal generated by the first electrode structure 108. The controller identifies the presence or the absence of at least one analyte in the fluid sample 122 based at least in part on the received sense signal. In an embodiment, the controller is coupled to the base substrate 102. In an embodiment, the controller is an integrated circuit component of the base substrate 102. In an embodiment, the controller is embedded within the base circuit 102. In an embodiment, the second electrode structure generates the sense signal. The controller is electrically coupled to the second electrode structure 116 and receives the sense signal from the second electrode structure 116. In an embodiment, the controller is configured to identify at least one analyte in the fluid sample 122 based in part on the sense signal received from the second electrode structure 116.

In an embodiment, a display is communicatively coupled to the controller. In an embodiment, the display is a component of the sensor system 100. The display is configured to display data associated with the identification of a presence of an analyte in the fluid sample 122 by the controller. Other mechanisms, such as for example, an audio output may be used to provide data associated with the identification of a presence of an analyte in the fluid sample 122 by the controller to a user.

Figure 2:
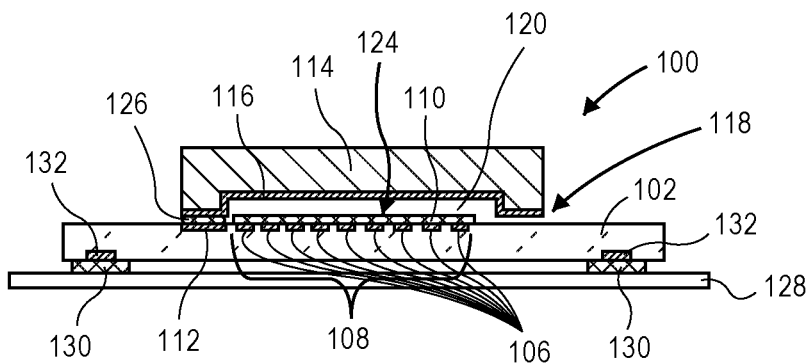
FIG. 2 is a side elevation cross-sectional view of a diagrammatic representation of an embodiment of a sensor system including a microfluidic cap.

Referring to FIG. 2, a diagrammatic representation of an embodiment of a sensor system 100 including a microfluidic cap 114 is shown. In an embodiment, the microfluidic cap 114 is coupled to the base substrate 102 and generally disposed over the first electrode structure 108. The microfluidic cap 114 is composed of electrically non-conductive dielectric material. Examples of electrically non-conductive dielectric materials include, but are not limited to, glass (e.g., a glass plate), a polymer (e.g., polystyrene), ceramic, and a creaming.

The second electrode structure 116 is disposed or formed along an inner surface of the microfluidic cap 114. In an embodiment, the second electrode structure 116 is disposed or formed along the entire inner surface of the microfluidic cap 114. In an embodiment, the second electrode structure 116 is disposed along a substantially planar portion of the inner surface of the microfluidic cap 114. The second electrode structure 116 is disposed in a space apart relationship with respect to the first electrode structure 108. In an embodiment, the second electrode structure 116 is generally parallel to the first electrode structure 108. In an embodiment, second electrode structure 116 is proximate to the assay chamber 120. In an embodiment, the inner surface of the microfluidic cap 114 and an upper surface of the base substrate 102 define the assay chamber 120 with the first electrode structure 108 and the second electrode structure 116 being on opposing sides of the assay chamber 120. In an embodiment, the first electrode structure 108 and the second electrode structure 116 define opposing sides of the assay chamber 120.

As mentioned above, the first electrode structure 108 includes a plurality of conductive elements 106. In an embodiment, the plurality of conductive elements 106 are located at approximately a center 124 of the base substrate 102.

The dispense chemistry 110 is disposed within the assay chamber 120. In an embodiment, the dispense chemistry 110 is disposed on at least a portion of the first electrode structure 108. In an embodiment, the dispense chemistry 110 is disposed on at least a portion of the second electrode structure 116. In an embodiment, the dispense chemistry 110 is disposed on at least a portion of both the first electrode structure 108 and the second electrode structure 116.

The sensor system 100 includes an aperture 118. The fluid sample 122 is deposited into the assay chamber 120 of the sensor system 100 via the aperture 118. In an embodiment, the fluid sample 122 is drawn into the assay chamber 120 through the aperture 118 using capillary action. In an embodiment, the aperture 118 is disposed between the microfluidic cap 114 and the base substrate 102. In an embodiment, the aperture 118 is defined by a portion of the inner surface of the microfluidic cap 114 and a portion of an upper surface of the base substrate 102. In an embodiment, the sensor system 100 includes multiple apertures 118. In an embodiment with multiple apertures 118, the fluid sample 122 enters the assay chamber 120 by via one of the multiple apertures 118 and exits the assay chamber 120 via another one of the multiple apertures 118.

In an embodiment, one or more contact pads 112 are disposed on an upper surface of the base substrate 102. One or more of the contact pads 112 are electrically coupled to active circuitry embedded or formed in the base substrate 102. Examples of such active circuitry include, but are not limited to, the first electrode structure 108, one or more of the conductive elements 106 in the first electrode structure 108, and the controller. The contact pads 112 are formed using conductive material. Examples of conductive materials that can be used to form a contact pad 112 include, but are not limited to, copper, aluminum, and tungsten.

In an embodiment, an electrically conductive material 126 is used to electrically couple one or more of the active circuit elements embedded or formed in the base structure 102 to one or more of the electrical components on the microfluidic cap 114 via contact pads 112. In an embodiment, the electrically conductive material 126 is used to mechanically couple the microfluidic cap 114 to the base substrate 102 via one or more of the contact pads 112 disposed on the base substrate 102. In an embodiment, the electrically conductive material 126 is used to both electrically couple one or more electrical components on the microfluidic cap 114 to one or more active circuit elements embedded or formed in the base substrate 102 and mechanically couple the microfluidic cap 114 to the base substrate 102. Examples of electrically conductive materials include, but are not limited to, solder, reflowed solder ball, and solder paste.

In an embodiment, an electrically conductive adhesive is used to electrically couple one or more of the active circuit elements embedded or formed in the base structure 102 to one or more of the electrical components on the microfluidic cap 114 via contact pads 112. In an embodiment, the electrically conductive adhesive is used to mechanically couple the microfluidic cap 114 to the base substrate 102 via one or more of the contact pads 112 disposed on the base substrate 102. In an embodiment, the electrically conductive adhesive is used to both electrically couple one or more electrical components on the microfluidic cap 114 to one or more active circuit elements embedded or formed in the base substrate 102 and mechanically couple the microfluidic cap 114 to the base substrate 102. Examples of electrically conductive adhesives include, but are not limited to, an epoxy and a conductive epoxy.

In an embodiment, a combination of electrically conductive material 126 and electrically conductive adhesive are used to electrically couple and/or mechanically couple one or more of the different components described above. In an embodiment, the electrically conductive adhesive is used in combination with one or more of glass fibers and at least one spacer to establish at least one aperture 118 between the base substrate 102 and the microfluidic cap 114.

In an embodiment, the sensor system 100 is configured to be electrically coupled and mechanically coupled to a circuit board 128. Examples of the circuit board 128 include, but are not limited to, a printed circuit board, a flexible substrate board, and a flexible printer plastic board. In an embodiment, the circuit board 128 is a component of a device. Examples of the devices include, but are not limited to, a mobile device, a smartphone, a wearable device, a tablet, a digital camera, a notebook computer, a media player, a portable gaming device, a computer, and an analysis instrument.

In an embodiment, the base substrate 102 includes one or more contact pads 132 disposed on a lower surface of the base substrate 102. In an embodiment, an electrically conductive material 130 is used to electrically and/or mechanically couple the sensor system 100 to the circuit board 128 via the one or more contact pads 132. Examples of electrically conductive materials 130 include, but are not limited to, solder, reflowed solder ball, and solder paste. In an embodiment, an electrically conductive adhesive is used to electrically and/or mechanically couple the sensor system 100 to the circuit board 128 via the one or more contact pads 132. Examples of electrically conductive adhesives include, but are not limited to, an epoxy, a conductive epoxy, and a die attach adhesive. In an embodiment, a combination of electrically conductive material 130 and electrically conductive adhesive are used to electrically and/or mechanically couple the sensor system 100 to the circuit board 128 via the one or more contact pads 132.

Referring to FIG. 3 a block diagram representation of an example of a first electrode structure 108 on a base substrate 102 of an embodiment of a sensor system 100 is shown. As mentioned above, the first electrode structure 108 includes a plurality of conductive elements 106. In an embodiment, the plurality of conductive elements 106 are arranged in the form of an array of conductive elements 106. In an embodiment, the array of conductive elements 106 is arranged as an M by N matrix, where M is the number of rows of conductive elements 106 in the M by N matrix and N is the number of columns of conductive elements 106 in the M by N matrix. In an embodiment, the M by N matrix of conductive elements 106 are located at approximately the center 124 of the base substrate 102. While an M by N matrix arrangement of the conductive elements 106 has been described, the plurality of conductive elements 106 can arranged in other configurations. Examples of other configurations include, but are not limited to, a square configuration, a rectangular configuration, a circular configuration, an irregular configuration, and a linear configuration.

In an embodiment, at least one conductive element 106 in the M by N matrix of conductive elements 106 includes a dummy element. In an embodiment, the M by N matrix of conductive elements 106 include at least one column and/or at least one row of dummy elements. The one or more dummy elements are coupled to an alternating current (AC) ground and/or other electric potential such that the one or more dummy elements do not function as a sensing element that facilitates the detection or absence of an analyte in a fluid sample 122.

Referring to FIG. 4, a block diagram representation of an example of a first electrode structure 108 with of dispense chemistry 110 disposed over the conductive elements 106 in an embodiment of a sensor system 100 is shown. The first electrode structure 108 includes a plurality of conductive elements 106 arranged in an M by N array. In an embodiment, dispense chemistry 110 is disposed over each individual conductive element 106 in the M by N array of conductive elements 106.

In an embodiment, dispense chemistry 110 forms individual dispense chemistry islands associated with each conductive element 106. In an embodiment, the dispense chemistry 110 covers an upper surface and sides of each individual conductive element 106. Each dispense chemistry 110 island includes the dispense chemistry 110 covering the upper surface and the sides of each of individual conductive element 108. In an embodiment, each dispense chemistry 110 island forms a substantially planar surface. In an embodiment, dispense chemistry 110 islands are formed on one or more of the conductive elements 106 in the M by N array. In an embodiment, the dispense chemistry 110 islands are formed over a subset of the M by N array of conductive elements 106.

Referring to FIG. 5, a block diagram representation of an example of a first electrode structure 108 with dispense chemistry 110 disposed over the surface of the first electrode structure 108 in an embodiment of a sensor system 100 is shown. The first electrode structure 108 includes a plurality of conductive elements 106 arranged in an M by N array.

In an embodiment, the dispense chemistry 110 covers substantially an entire surface of the first electrode structure 108. The dispense chemistry 110 covers the upper surface and sides of each individual conductive element 106, the areas of the surface of the first electrode structure 108 between adjacent conductive elements 106, and the areas of the first electrode structure 108 extending beyond a perimeter defined by the outer of the conductive elements 106 in the M by N array. In an embodiment, the dispense chemistry 110 forms a substantially planar surface. In an embodiment, dispense chemistry 110 is disposed over one or more of the conductive elements 106 in the M by N array. In an embodiment, the dispense chemistry 110 are disposed over a subset of the M by N array of conductive elements 106.

Referring to FIG. 6, a cutout block diagram representation of an example an assay chamber 120 with dispense chemistry 110 disposed within the assay chamber 120 in an embodiment of a sensor system 100 is shown. In an embodiment of the sensor system 100, the assay chamber 120 is disposed between the microfluidic cap 114 and the base substrate 102. In an embodiment, the assay chamber 120 is disposed between the first electrode structure 108 and the second electrode structure 116. In an embodiment, opposing sides of the assay chamber 120 are defined by the first electrode structure 108 and the second electrode structure 116. The first electrode structure 108 includes a plurality of conductive elements 106. The fluid sample 122 is deposited into the assay chamber 120.

In an embodiment, the dispense chemistry 110 includes one or more microbeads 136. In an embodiment, the dispense chemistry 110 is a dried aqueous solution including one or more coated microbeads 136. In an embodiment, the dispense chemistry 110 is a dried aqueous solution including an array of microbeads 136. In an embodiment, the one or more coated microbeads 136 are formed using one or more of a polymer, glass, and metal. In an embodiment, one or more of the coated microbeads 136 are hollow. In an embodiment, one or more of the coated microbeads 136 have a core including a material that is different from the material used to form an outer surface of the one or more microbeads 136.

In an embodiment, each individual coated microbead 136 has a coating specific to a desired assay or combination of assays. In an embodiment, the dispense chemistry 110 is configured to provide an immunoassay and includes one or more coated microbeads 136 having an antibody to detect a specific antigen. In an embodiment, the dispense chemistry 110 is configured to provide an immunoassay and includes one or more coated microbeads 136 having an antigen specific coating. An example of an antigen is human chorionic gonadotropin (hCG) hormone.

In an embodiment, a dispense chemistry 110 is configured as a coagulation assay. In an embodiment, the dispense chemistry 110 includes one or more coated microbeads 136 with a coating of thromboplastin. In an embodiment, the dispense chemistry 110 is configured as an electrochemical assay. In an embodiment, the dispense chemistry 110 includes one or more coated microbeads 136 with a coating that includes sodium. In an embodiment, the dispense chemistry 110 includes one or more coated microbeads 136 with a coating that includes glucose.

In an embodiment, the dispense chemistry 110 includes one or more coated microbeads 136 with a coating for a molecular assay. In an embodiment, the dispense chemistry 110 includes one or more coated microbeads 136 with a coating for a biochemical assay. In an embodiment, the one or more microbeads 136 are configured to detect a single analyte. In an embodiment, the one or more microbeads 136 are configured to detect multiple analytes. In an embodiment, the one or more microbeads 136 are configured to detect a specific combination of analytes. Examples of analytes include, but are not limited to, blood cells, pharmaceuticals, drugs, chemicals, ions, elements, alcohol, glucose, fructose, malic acid, metals, and nutrients.

As mentioned above, the assay includes a test that is performed by introducing the fluid sample 122 into the assay chamber 120 including the dispense chemistry 110. The fluid sample 122 interacts with the dispense chemistry 110. The second electrode structure 116 generates one or more electrical signals 134 that pass through at least a portion of the fluid sample 122. The first electrode structure 108 detects at least a portion of the one or more electrical signals 134 that pass through the fluid sample 122 and responsively generates a sense signal. The sense signal is indicative of the presence and/or absence of specific analytes in the fluid sample 122. For example, coated microbeads 136 may agglutinate or agglomerate when a certain analyte is present in the fluid sample 122. The electrical signal 134 that passes through the fluid sample 122 is impacted by the agglutination or agglomeration associated with the presence of the analyte. The sense signal is indicative of the impact of the agglutination or agglomeration associated with the presence of the analyte. The controller is electrically coupled to the first electrode structure 108 and is configured to detect the presence of the analyte in the fluid sample 122 based at least in part on the sense signal received from the first electrode structure 108.

Referring to FIG. 7, a block diagram representation of an embodiment of a sensor system 100 including an example of a microfluidic cap 114 having a stepped configuration is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In an embodiment, second electrode structure 116 is proximate to the assay chamber 120. In an embodiment, the stepped inner surface of the microfluidic cap 114 and an upper surface of the base substrate 102 define the assay chamber 120. In an embodiment, the first electrode structure 108 and the second electrode structure 116 define opposing sides of the assay chamber 120.

As mentioned above, the first electrode structure 108 includes a plurality of conductive elements 106. In an embodiment, the plurality of conductive elements 106 are located at approximately a center 124 of the base substrate 102. The dispense chemistry 110 is disposed within the assay chamber 120. In an embodiment, the dispense chemistry 110 is disposed on at least a portion of the first electrode structure 108. In an embodiment, the dispense chemistry 110 is disposed on at least a portion of the second electrode structure 116. In an embodiment, the dispense chemistry 110 is disposed on at least a portion of both the first electrode structure 108 and the second electrode structure 116. The sensor system 100 includes at least one aperture 118.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance. Different portions of the microfluidic cap 114 having different distances from the first electrode structure 108 may enable the analysis of multiple analytes where at least one analyte has a different size compared to a second analyte in a fluid sample 122.

In an embodiment, a platform 104 partially encloses the base substrate 102. In an embodiment, the platform 104 extends along a lower surface of the base substrate 102, along the sides of the base substrate 102 and along portions of the upper surface of the base substrate 102 on either side of the microfluidic lid 114. In an embodiment, at least one through via 140 extends from a lower surface of the platform 104 to the base substrate 102. One or more components on and/or embedded within the base substrate 102 are electrically coupled to the circuit board 128 using the through via 140. For example, a first end of the through via 140 is electrically coupled to a contact pad on the base substrate 102 and a second end of the through via 140 is electrically and mechanically coupled to the circuit board 128 using electrically conductive material 130.

Referring to FIG. 8 a block diagram representation of an embodiment of a sensor system 100 including an example of a microfluidic cap 114 having a stepped configuration is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance.

In an embodiment, the platform 104 extends along a lower surface of the base substrate 102. In an embodiment, at least one through via 140 extends from a lower surface of the platform 104 through the width of the platform 104 to an upper surface of the platform 104. In an embodiment, at least one filled through via 142 extends from a lower surface of the base substrate 102 through the width of the base substrate 102 to an upper surface of the base substrate 102. One or more components on and/or embedded within the base substrate 102 are electrically coupled to the circuit board 128 using the filled through via 142 and the through via 140.

Referring to FIG. 9, a block diagram representation of an embodiment of a sensor system 100 including an example of a microfluidic cap 114 having a stepped configuration is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance.

In an embodiment, electrically conductive material 126 is used to mechanically couple the microfluidic cap 114 to the base substrate 102 via one or more of the contact pads 112 disposed on the base substrate 102. In an embodiment, the electrically conductive material 126 is used to both electrically couple one or more electrical components on the microfluidic cap 114 to one or more active circuit elements embedded or formed in the base substrate 102 and to mechanically couple the microfluidic cap 114 to the base substrate 102. Examples of electrically conductive materials 126 include, but are not limited to, solder, reflowed solder ball, and solder paste. In an embodiment at least one of a pillar and a post is used to mechanically couple the microfluidic cap 114 to the base substrate 102.

Referring to FIG. 10, a block diagram representation of an embodiment of a sensor system 100 including an example of a microfluidic cap 114 having a stepped configuration is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance.

In an embodiment, the second electrode structure 116 in the microfluidic cap 114 is electrically and/or mechanically coupled to one or more components of the base substrate 102 using an adhesive 132. In an embodiment, the adhesive 132 is a conductive adhesive. In an embodiment, the adhesive 132 is a conductive epoxy. In an embodiment, the second electrode structure 116 is electrically and/or mechanically coupled to one or more components of the base substrate 102 using a combination of an adhesive 132 and an electrically conductive material 126. Examples of the second electrode structure 116 may include, but are not limited to a working electrode, a reference electrode, an auxiliary electrode, and a counter electrode. In an embodiment, the second electrode structure 116 is an electrochemical cell.

Referring to FIG. 11, a block diagram representation of an embodiment of a sensor system 100 including a microfluidic cap 114 having a stepped configuration and at least one aperture 118 extending through the microfluidic cap 114 is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance.

In an embodiment, at least one aperture 118 extends through the microfluidic cap 114 into the assay chamber 120. In an embodiment, a first aperture extends through a first portion of the microfluidic cap 114 where the section of the second electrode structure 116 adjacent the first aperture 118 is disposed at a first distance with respect to the first electrode structure 108 and a second aperture extends through a second portion of the microfluidic cap 114 where the section of the second electrode structure 116 adjacent the second aperture 118 is disposed at a second distance with respect to the first electrode structure 108. The first distance is different than the second distance.

Referring to FIG. 12, a block diagram representation of an embodiment of a sensor system 100 including a microfluidic cap 114 having a stepped configuration and at least one aperture 118 extending through the microfluidic cap 114 is shown. The inner surface of the microfluidic cap 114 has a stepped configuration. The microfluidic cap 114 is coupled to the base substrate 102 and generally disposed over the first electrode structure 108. In an embodiment, the second electrode structure 116 is disposed or formed along the stepped configuration of the inner surface of the microfluidic cap 114. In an embodiment, the second electrode structure 116 is disposed along substantially planar portions of the stepped inner surface of the microfluidic cap 114 that is generally parallel to the upper surface of the base substrate 102.

In alternative embodiments, the inner surface of the microfluidic cap 114 can have different configurations. In an embodiment, different portions of the microfluidic cap 114 are disposed at different distances from the first electrode structure 108. In an embodiment, a first portion of the microfluidic cap 114 is generally parallel to the base substrate 102 and disposed at a first distance with respect to the first electrode structure 108 and a second portion of the microfluidic cap 114 is generally parallel to the base substrate 102 and disposed at a second distance with respect to the first electrode structure 108, where the first distance is different than the second distance.

In an embodiment, at least one aperture 118 extends through the microfluidic cap 114 into the assay chamber 120. In an embodiment, a first aperture 118 extends through a first portion of the microfluidic cap 114 where the section of the second electrode structure 116 adjacent the first aperture 118 is disposed at a first distance with respect to the first electrode structure 108 and a second aperture 118 extends through a second portion of the microfluidic cap 114 where the section of the second electrode structure 116 adjacent the second aperture 118 is disposed at a second distance with respect to the first electrode structure 108. The first distance is different than the second distance. In an embodiment, the second electrode structure 116 extends along the inner surface of the one or more apertures 118.

In an embodiment, the second electrode structure 116 in the microfluidic cap 114 is electrically and/or mechanically coupled to one or more components of the base substrate 102 using an adhesive 132. In an embodiment, the adhesive 132 is a conductive adhesive. In an embodiment, the adhesive 132 is a conductive epoxy. In an embodiment, the second electrode structure 116 is electrically and/or mechanically coupled to one or more components of the base substrate 102 using a combination of an adhesive 132 and an electrically conductive material 126.

Referring to FIG. 13, a block diagram representation of a sensor system 100 including a microfluidic cap 114 is shown. In an embodiment, the microfluidic cap 114 includes a cavity 151. In an embodiment, the cavity 151 is created using an etching process. The microfluidic cap 114 is coupled to the base substrate 102 and the cavity 151 is generally disposed over the first electrode structure 108. In an embodiment, a perimeter of the assay chamber 120 is defined by the cavity 151 and the base substrate 102. The second electrode structure 116 is disposed within the cavity 151 along the inner surface of the microfluidic cap 114.

In an embodiment, at least one aperture 118 extends from an upper surface of the microfluidic cap 114 into the assay chamber 120. In an embodiment, two apertures 118 extend from the upper surface of the microfluidic cap 114 into the assay chamber 120. In an embodiment, the fluid sample 122 enters the assay chamber 120 by way of one of the two apertures 118 and exits the assay chamber 120 by way of the other one of the two apertures 118. In an embodiment, the fluid sample 122 is drawn into the assay chamber 120 using capillary action. While two apertures 118 are shown, a fewer or greater number of apertures 118 may extend from an upper surface of the microfluidic cap 114 into the assay chamber 120.

Referring to FIG. 14, a block diagram representation of a sensor system 100 including a microfluidic cap 114 is shown. In an embodiment, the microfluidic cap 114 includes a cavity 151. In an embodiment, the cavity 151 is created using an etching process. The microfluidic cap 114 is coupled to the base substrate 102 and the cavity 151 is generally disposed over the first electrode structure 108. In an embodiment, a perimeter of the assay chamber 120 is defined by the cavity 151 and the base substrate 102. The second electrode structure 116 is disposed within the cavity 151 along the inner surface of the microfluidic cap 114.

In an embodiment, at least one aperture 118 extends from a side surface of microfluidic cap 114 into the assay chamber 120. In an embodiment, a first aperture 118 extends from a first side surface of the microfluidic cap 114 into the assay chamber 120 and a second aperture 118 extends from a second side surface of the microfluidic cap 114 into the assay chamber. In an embodiment, the first and second side surfaces of the microfluidic cap 114 are opposing side surfaces. In an embodiment, the fluid sample 122 enters the assay chamber 120 by way of one of the first and second apertures 118 and exits the assay chamber 120 by way of the other one of the first and second apertures 118. In an embodiment, the fluid sample 122 is drawn into the assay chamber 120 using capillary action. While two apertures 118 are shown, a fewer or greater number of apertures 118 may extend from one or more of the side surfaces of the microfluidic cap 114 into the assay chamber 120.

Referring to FIG. 15A, a block diagram representation of an embodiment of a sensor system 100 including an example of a microfluidic cap 114 having a stepped configuration is shown. The inner surface of the microfluidic cap 114 has a stepped configuration. In an embodiment, the second electrode structure 116 is disposed or formed along the stepped configuration of the inner surface of the microfluidic cap 114. The first electrode structure 108 including the plurality of conductive elements 106 is disposed on an upper surface of the base substrate 102.

In an embodiment, the stepped configuration includes first, second, and third steps. The first step surface is disposed at a first distance from at least a first set of conductive elements 106 thereby defining a first portion of the assay chamber 120 having first width 152. The second step surface is disposed at a second distance from a second set of conductive elements 106 thereby defining a second portion of the assay chamber 120 having second width 154. The third step surface is disposed at a third distance from a third set of conductive elements 106 thereby defining a third portion of the assay chamber 120 having third width 156. The second width 154 is greater than the first width 152. The third width 156 is greater than the second width 154. While a stepped configuration including three steps has been described, alternative embodiments may include a fewer or greater number of steps. Each of the first, second, and third set of conductive elements 106 includes at least one conductive element 106.

In an embodiment, the stepped inner surface of the microfluidic cap 114 and the upper surface of the base substrate 102 define the assay chamber 120. The first electrode structure 108 and the second electrode structure 116 are disposed on opposing sides of the assay chamber 120.

The dispense chemistry 110 is disposed within the assay chamber 120. In an embodiment, the dispense chemistry 110 is disposed over substantially the entire surface of the first electrode structure 108. In an embodiment, the dispense chemistry 110 is disposed on at least a portion of the first electrode structure 108. In an embodiment, the dispense chemistry 110 is disposed on at least a portion of the second electrode structure 116. In an embodiment, the dispense chemistry 110 is disposed on at least a portion of both the first electrode structure 108 and the second electrode structure 116. In an embodiment the dispense chemistry 110 is disposed on a subset of the plurality of conductive elements 106.

The sensor system 100 includes at least one aperture 118. In an embodiment, an aperture 118 is disposed on a side surface of the microfluidic cap 114. In an embodiment, multiple apertures 118 are disposed on one or more different side surfaces of the microfluidic cap 114.

In an embodiment, at least one structure may be formed on and/or within the microfluidic cap 114, such as a bluff and/or a mesa. The multiple surfaces in the stepped configuration of the microfluidic cap 114 may allow for different sensitivities and/or can be used to filter a fluid sample 122 in the assay chamber 120 such that each portion of the assay chamber 120 in the multi-level second electrode structure 116 may be sensitive to a different range of particle sizes.

Referring to FIG. 15B a block diagram representation of the embodiment of a sensor system 100 of FIG. 15A including an example of a microfluidic cap 114 having a stepped configuration with multiple different analytes disposed within the assay chamber 120 is shown. The stepped configuration of the microfluidic cap 114 enables the analysis of multiple analytes where each of the multiple analytes have a different size.

For example, the first portion of the assay chamber 120 having the first width 152 enables a first analyte 144 having dimensions that do not exceed the first width 152 to enter the first portion of the assay chamber 120. However, the second analyte 146 and the third analyte 148 have dimensions that exceed the first width 152 and are unable to enter the first portion of the assay chamber 120.

The second portion of the assay chamber 120 having the second width 154 enables the first analyte 144 and a second analyte 146 to enter the second portion of the assay chamber 120 where the first analyte 144 and the second analyte 146 have dimensions that do not exceed the second width 154 of the assay chamber 120. However, the third analyte 148 has dimensions that exceed the second width 154 and is unable to enter the second portion of the assay chamber 120.

The third portion of the assay chamber 120 having the third width 156 enables the first analyte 144, the second analyte 146 and a third analyte 148 to enter the third portion of the assay chamber 120 where the first analyte 144, the second analyte 146, and the third analyte 148 have dimensions that do not exceed the third width 156 of the assay chamber 120.

An embodiment of the sensor system 100 can be configured to analyze a blood fluid sample 122 where the first analyte 144 is platelets, the second analyte 146 is red blood cells, and the third analyte 148 is white blood cells. The third portion of the assay chamber 120 is sized to have the width 156 that will enable the platelets, the red blood cells, and the white blood cells to enter the third portion of the assay chamber 120.

The second portion of the assay chamber 120 is sized to have the width 154 that will enable the platelets and the red blood cells to enter the second portion of the assay chamber 120. The width 154 is sized so that it is too narrow to enable the relative larger size white blood cells, to enter the second portion of the assay chamber 120.

The first portion of the assay chamber 120 is sized to have the width 152 that will enable the smallest analyte, platelets, to enter the first portion of the assay chamber 120. The width 152 is sized so that it is too narrow to enable the relative larger size analytes, the red blood cells and the white blood cells, to enter the first portion of the assay chamber 120.

Example Processes

FIG. 16A through FIG. 16H are diagrammatic representations of the different stages of an embodiment of the sensor system during an example fabrication process.

Referring to FIG. 16A, the first electrode structure 108 including the plurality of conductive elements 106 are formed or disposed on the base substrate 102. One or more contact pads 112 are disposed on the base substrate 102.

Referring to FIG. 16B, in an embodiment, the dispense chemistry 110 is applied to the first electrode structure 108 such that one or more of the conductive elements 106 are overlaid with the dispense chemistry 110. In an embodiment the dispense chemistry 110 is sprayed on one or more conductive elements 106 of the first electrode structure 108. In an embodiment, the dispense chemistry 110 is dropped on one or more conductive elements 106 of the first electrode structure 108.

Referring to FIG. 16C, in an embodiment, a liquid form of the dispense chemistry 110 is sprayed onto one or more of the conductive elements 106 in the first electrode structure 108 using a removable template 338. The removable template 338 is configured to cover portions of the first electrode structure 108 in a manner that enables the application of the liquid form of the dispense chemistry 110 onto selected conductive elements 106 in the first electrode structure 108. The removable template 338 is configured to cover portions of the first electrode structure 108 in a manner that enables the application of the liquid form of the dispense chemistry 110 onto all of the conductive elements 106 in the first electrode structure 108

In an embodiment, the application of dispense chemistry 110 to one or more of the conductive elements 106 of the electrode structure 108 can include pre-forming (e.g., spraying and/or drying) the dispense chemistry 110 and subsequently placing the dispense chemistry 110 on the one or more conductive element 106 using a pick-and-place type process and equipment.

In alternative embodiments, the application of the dispense chemistry 110 to one or more conductive elements 106 of the first electrode structure 108 may involve the use of other application techniques such as for example including, but not limited to, jetting (e.g., using a jet to spray the dispense chemistry 110), printing the dispense chemistry 110, and/or using a pico-dispense method.

Referring to FIG. 16D, in an embodiment, the application of the dispense chemistry 110 involving the placing and/or forming the dispense chemistry 110 on the conductive elements 106 of the first electrode structure 108 and then drying the dispense chemistry 110. Examples of drying techniques include, but are not limited to, using air convection and heat. In an embodiment, the dispense chemistry 110 is at least partially dried using a drying enhancer that can be added to a liquid dispense chemistry 110. Examples of drying enhancers include, but are not limited to, maltodextrin, a detergent, and alcohol.

Although the dispense chemistry 110 is illustrated in the above figures as non-planar, the dispense chemistry 110 can placed such that, once dried, the dispense chemistry 110 is planar or substantially planar with the surface of the first electrode structure 108.

Referring to FIG. 16E, in an embodiment, an electrically conductive material 126, such as for example solder, is placed on the one or more contact pads 112 using a ball drop process and/or by applying and reflowing solder paste. In an embodiment, a conductive adhesive (e.g., conductive epoxy) is placed on one or more contact pads 112. Examples of techniques used to place the conductive adhesive include, but are not limited to, spraying, dropping, and/or a brushing process.

Referring to FIG. 16F, the microfluidic cap 114 is positioned on the base substrate 102. In an embodiment, the microfluidic cap 114 is positioned on the base substrate 102 using a pick-and-place operation. The microfluidic cap 114 is positioned on the base substrate 102 such that the microfluidic cap 114 is properly aligned with the one or more contact pads 112, and the first electrode structure 108. The microfluidic cap 114 is placed substantially planar with, over, and/or parallel to the base substrate 102 and the first electrode 108 to properly define one or more apertures 118 and/or the assay chamber 120.

In an embodiment, the second electrode 116 is disposed on the microfluidic cap 114. In an embodiment, the second electrode 116 is formed on the microfluidic cap 114. In an embodiment, the second electrode 116 is formed as a partitioned electrode (e.g., the second electrode 116 is formed on a portion of the microfluidic cap 114). In an embodiment, forming the second electrode 116 includes forming two or more second electrode 116 sections, where a first section of the second electrode 116 is disposed proximate to a first portion (e.g., a first specific conductive element 106) of the first electrode 108, and a second section of the second electrode 116 is disposed proximate to a second portion (e.g., a second specific conductive element 106 that is different than the first specific conductive element 106) of the first electrode 108.

In an embodiment, a pick-and-place process is used to place the electrode material used to form the second electrode 116 in the microfluidic cap 114. Examples of electrode materials include, but are not limited to, conductive material and a metal. In an embodiment, the second electrode 116 is formed by depositing electrode material on the microfluidic cap 114 using a plating technique and/or a spraying technique (e.g., spraying a conductive ink). In an embodiment, the second electrode structure 116 is formed on the microfluidic cap 114 using a photolithographic process, such as deposition (e.g., physical vapor deposition, chemical vapor deposition, sputtering, and so forth), masking, lift-off after masking, and/or etching.

In an embodiment, the second electrode 116 on and/or embedded within the microfluidic cap 114 is coupled to the electrically conductive material 126 disposed on the contact pad 112. The combination of the electrically conductive material 126 and the contact pad 112 provides an electrical connection between the second electrode structure 116, the first electrode structure 108, and other components embedded within the base substrate 102. In an embodiment, the second electrode structure 116 is electrically coupled to the base substrate 102 using a conductive adhesive.

Referring to FIG. 16G a conductive adhesive 122 disposed on a side of the microfluidic cap 114 away from an aperture 118 and electrically couples the contact pad 112, the electrically conductive material 126, and the second electrode structure 116. Additional processes may include reflowing electrical connections 126, encapsulating at least a portion of the sensor package 100, and/or coupling the sensor package 100 to a platform 104 and/or a circuit board 128.

Referring to FIG. 16H, in an embodiment of the dispense chemistry 110 is applied to both the first electrode structure 108 and the second electrode structure 116.

Referring to FIG. 17, a flowchart representation of an example of a method 1700 of using an embodiment of the sensor system 100 is shown. In general, the operations of disclosed method 1700 may be performed in an arbitrary order, unless otherwise provided in the claims. A fluid sample 122 is received inside an assay chamber 120 via at least one aperture 118 at 1702. The fluid sample 122 interacts with the dispense chemistry 110 in the assay chamber 120 at 1704. At least one electrical signal 134 is transmitted from second electrode structure 116 at 1706. The at least one electrical signal 134 passes through the fluid sample 122 at 1708. The conductive elements 106 of the first electrode structure 108 receive the at least one electrical signal 134 transmitted by second electrode structure 116 following the passage of the at least one electrical signal 134 through the fluid sample 122 at 1710. The first electrode structure 108 generates a sense signal based on the received at least one electrical signal 134 at 1712. The sense signal is indicative of an interaction between the fluid sample 122 and the dispense chemistry 110. The controller receives the sense signal from the first electrode structure 108 at 1714. The controller identifies the presence or absence of at least one analyte in the fluid sample 122 based at least in part on the received sense signal at 1716.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A sensor system, comprising:
an assay chamber configured to receive a fluid sample;
dispense chemistry disposed within the assay chamber;
a first electrode structure comprising at least one conductive element;
a second electrode structure proximate to the first electrode structure, the second electrode structure including:
a plurality of steps arranged in a stepped configuration, each step defining a respective region within the assay chamber, the stepped configuration configured to filter analytes or particles in the fluid sample into a respective region based on a size of the analytes or particles, and
a plurality of electrodes, each electrode corresponding to a respective step among the plurality of steps, each electrode is configured to transmit a corresponding electrical signal through the respective region, the plurality of electrodes configured to transmit at least one electrical signal through the fluid sample;
the first electrode structure being configured to receive at least a portion of at least one electrical signal transmitted through the fluid sample and responsively generate a sense signal that corresponds to one or more electrodes that transmitted the at least one electrical signal among the plurality of electrodes, the sense signal being indicative of an interaction of the fluid sample with the dispense chemistry located within a respective region associated with the at least one or more electrodes;
a controller electrically coupled to the first electrode structure and configured to identify at least one analyte in the fluid sample based on at least the sense signal generated by the first electrode structure; and
a base substrate, wherein one of the first electrode structure and the second electrode structure is embedded within the base substrate.

2. The sensor system of claim 1, further comprising a microfluidic cap coupled to the base substrate, wherein the other one of the first electrode structure and the second electrode structure is embedded within the microfluidic cap.

3. The sensor system of claim 1, wherein the first and second electrode structures define at least a portion of opposing surfaces of the assay chamber.

4. The sensor system of claim 1, wherein the dispense chemistry comprises a dried aqueous solution comprising a plurality of coated microbeads.

5. The sensor system of claim 4, wherein the plurality of coated microbeads comprises at least one of: polymer microbeads, glass microbeads, and metal microbeads.

6. The sensor system of claim 4, wherein the plurality of coated microbeads is coated with at least one of: an antibody, an antigen, sodium and glucose.

7. The sensor system of claim 1, wherein the dispense chemistry is disposed on at least one of: the first electrode structure and the second electrode structure.

8. The sensor system of claim 1, wherein the sensor system comprises a single chip.

9. A sensor system, comprising:
a base substrate;
an assay chamber configured to receive a fluid sample;
dispense chemistry disposed within the assay chamber, the dispense chemistry comprising a dried aqueous solution having a plurality of coated microbeads;
a first electrode structure disposed in the base substrate within the assay chamber and comprising an array of conductive elements arranged in a M by N matrix, M being a number of rows of conductive elements and N being a number of columns of conductive elements;
a microfluidic cap coupled to the base substrate and comprising a second electrode structure disposed within the assay chamber, the second electrode structure being proximate to the first electrode structure, the second electrode structure including:
  a plurality of steps arranged in a stepped configuration, each step defining a respective region within the assay chamber, the stepped configuration configured to filter analytes or particles in the fluid sample into a respective region based on a size of the analytes or particles, and
  a plurality of electrodes, each electrode corresponding to a respective step among the plurality of steps, each electrode is configured to transmit a corresponding electrical signal through the respective region, the plurality of electrodes configured to transmit at least one electrical signal through the fluid sample;
the first electrode structure being configured to receive at least a portion of the at least one electrical signal transmitted through the fluid sample and responsively generate a sense signal that corresponds to one or more electrodes that transmitted the at least one electrical signal among the plurality of electrodes, the sense signal being indicative of an interaction of the fluid sample with the dispense chemistry located within a respective region associated with the at least one or more electrodes; and
a controller electrically coupled to the first electrode structure and configured to identify at least one analyte in the fluid sample based at least on the sense signal generated by the first electrode structure.

10. The sensor system of claim 9, wherein the dispense chemistry is disposed on the array of conductive elements and in the area between adjacent conductive elements in the array of conductive elements.

11. The sensor system of claim 9, wherein the dispense chemistry is disposed on the array of conductive elements to form a layer of film, wherein thickness of the layer of film is approximately 1 μm.

12. The sensor system of claim 9, wherein the dispense chemistry forms a hydrophilic surface on at least one of: the first electrode structure and the second electrode structure.

13. The sensor system of claim 9, wherein the dried aqueous solution comprises at least one of: a detergent, an alcohol, and a starch.

14. The sensor system of claim 9, wherein the plurality of coated microbeads comprises at least one of: polymer microbeads, glass microbeads, and a metal microbeads.

15. The sensor system of claim 9, wherein the plurality of coated microbeads is coated with at least one of: an antibody, an antigen, sodium and glucose.

16. A sensor system, comprising:
a base substrate;
an assay chamber configured to receive a fluid sample;
dispense chemistry disposed within the assay chamber;
a sensor embedded within the base substrate, the sensor comprising a first electrode structure;
a microfluidic cap coupled to the base substrate and comprising a second electrode structure, the second electrode structure including:
  a plurality of steps arranged in a stepped configuration, each step defining a respective region within the assay chamber, the stepped configuration configured to filter analytes or particles in the fluid sample into a respective region based on a size of the analytes or particles, and
  a plurality of electrodes, each electrode corresponding to a respective step among the plurality of steps, each electrode is configured to transmit a corresponding electrical signal through the respective region, the plurality of electrodes configured to transmit at least one electrical signal through the fluid sample;
the first electrode structure being configured to receive at least a portion of the at least one electrical signal transmitted through the fluid sample and responsively generate a sense signal that corresponds to one or more electrodes that transmitted the at least one electrical signal among the plurality of electrodes, the sense signal being indicative of an interaction of the fluid sample with the dispense chemistry located within a respective region associated with the at least one or more electrodes; and
a controller electrically coupled to the first electrode structure and configured to identify at least one analyte in the fluid sample based on at least the sense signal generated by the first electrode structure.

17. The sensor system of claim 16, wherein the dispense chemistry comprises a dried aqueous solution having a plurality of coated microbeads.

18. The sensor system of claim 1, wherein the stepped configuration of the second electrode defines a plurality of portions of the assay chamber, each portion of the plurality of portions having a different distance from the first electrode structure compared to the other portions.

19. The sensor system of claim 18, wherein the stepped configuration of the second electrode is configured to filter the fluid sample based on the different distances of each portion.

* * * * *